United States Patent [19]

Bourel et al.

[11] Patent Number: 4,790,750

[45] Date of Patent: Dec. 13, 1988

[54] AUTOMATED FLEXIBLE INSTALLATION FOR A RAPID THERMOCHEMICAL TREATMENT

[75] Inventors: Jean Bourel, Le Perreux S/Marne; Denis Lebeaupin, Charenton; Olivier Schweibel, Courcouronnes, all of France

[73] Assignee: Stein Heurtey, Ris Orangis, France

[21] Appl. No.: 920,362

[22] Filed: Oct. 20, 1986

[30] Foreign Application Priority Data

Feb. 12, 1986 [FR] France ................................. 8601913

[51] Int. Cl.[4] ........................ F27D 3/00; F27D 3/12
[52] U.S. Cl. .................................... 432/239; 414/217; 414/221; 432/2; 432/5; 432/241; 432/253
[58] Field of Search ............... 432/239, 241, 205, 253, 432/5, 6, 2; 414/217, 221

[56] References Cited

U.S. PATENT DOCUMENTS

| | | | |
|---|---|---|---|
| 1,838,015 | 12/1931 | Von Forster et al. | 432/241 |
| 3,836,325 | 9/1974 | Nakamura et al. | 432/241 |
| 3,867,093 | 2/1975 | Huttermann | 432/241 |
| 4,033,715 | 7/1977 | Beck | 432/5 |
| 4,170,815 | 10/1979 | Tokitsu | 432/5 |
| 4,210,097 | 7/1980 | Byrd et al. | 432/2 |
| 4,405,435 | 9/1983 | Tateishi et al. | |
| 4,412,812 | 11/1983 | Sadowski et al. | 432/253 |
| 4,592,306 | 6/1986 | Gallego | |
| 4,610,628 | 9/1986 | Mizushina | 432/241 |
| 4,613,305 | 9/1986 | Sakurai | 432/253 |

FOREIGN PATENT DOCUMENTS

| | | |
|---|---|---|
| 2165849 | 8/1973 | France . |
| 2183557 | 12/1973 | France . |
| 2403645 | 4/1979 | France . |
| 2526813 | 11/1983 | France . |

OTHER PUBLICATIONS

Patent Abstract of Japan, vol. 8, No. 130 (C229) (1567), Jun. 16, 1984; JP-A 59 470 (Shimazu Seisakusho K. K.), Mar. 7, 1984.
Patent Abstract of Japan; vol. 7, No. 204 (E-197) (1349), Sep. 9, 1983; & JP-A-58 101 478 (Tokyo), Shibaura Denki K.K.) Jun. 6, 1983.
Patent Abstracts of Japan, vol. 8, No. 11 JP-A-58 180 227, (Samuko International Kenkusho K.K.) Oct. 21, 1983.
Patent Abstracts of Japan, vol. 5, No. 45 (C-48); JP-A-56,274 (Hitachi Seisakusho K.K.), Jan. 6, 1981.
Patent Abstracts of Japan, vol. 9, No. 5 (C-260) (1728) & JP-A-59 157 281, (Tokuda Seidakusho K.K.) Sep. 6, 1984.

Primary Examiner—Henry C. Yuen
Attorney, Agent, or Firm—Sandler & Greenblum

[57] ABSTRACT

An automated installation for the rapid thermochemical treatment of parts, notably for the mechanical industry, characterized in that it includes: a transfer lock for the parts under a controlled atmosphere; a plurality of treatment modules of the parts, all said modules being connected to said transfer lock; a loading lock; an unloading lock, and a handling robot for the parts, disposed in said transfer lock in order to provide for the successive transfers of parts between the various modules.

12 Claims, 5 Drawing Sheets

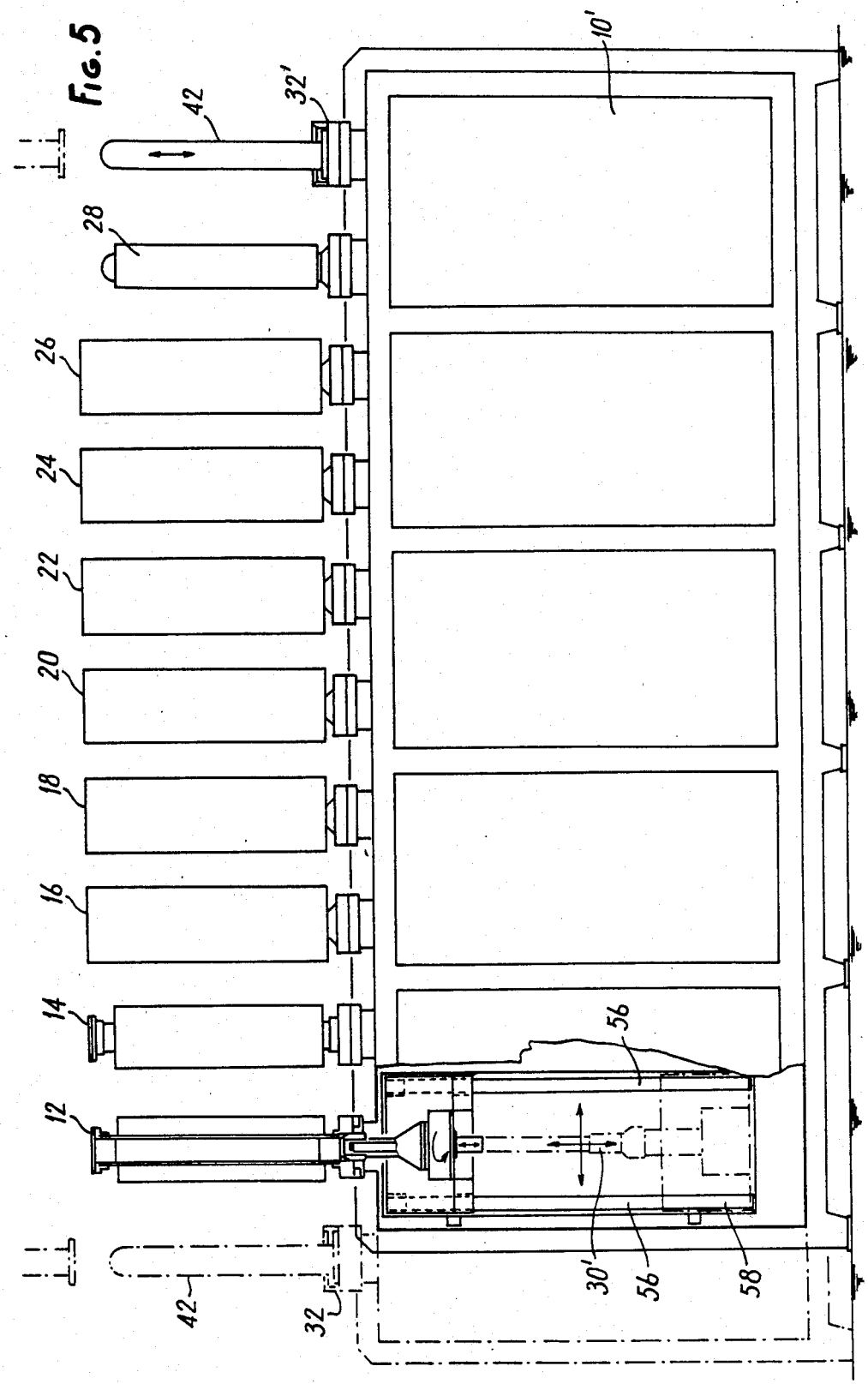

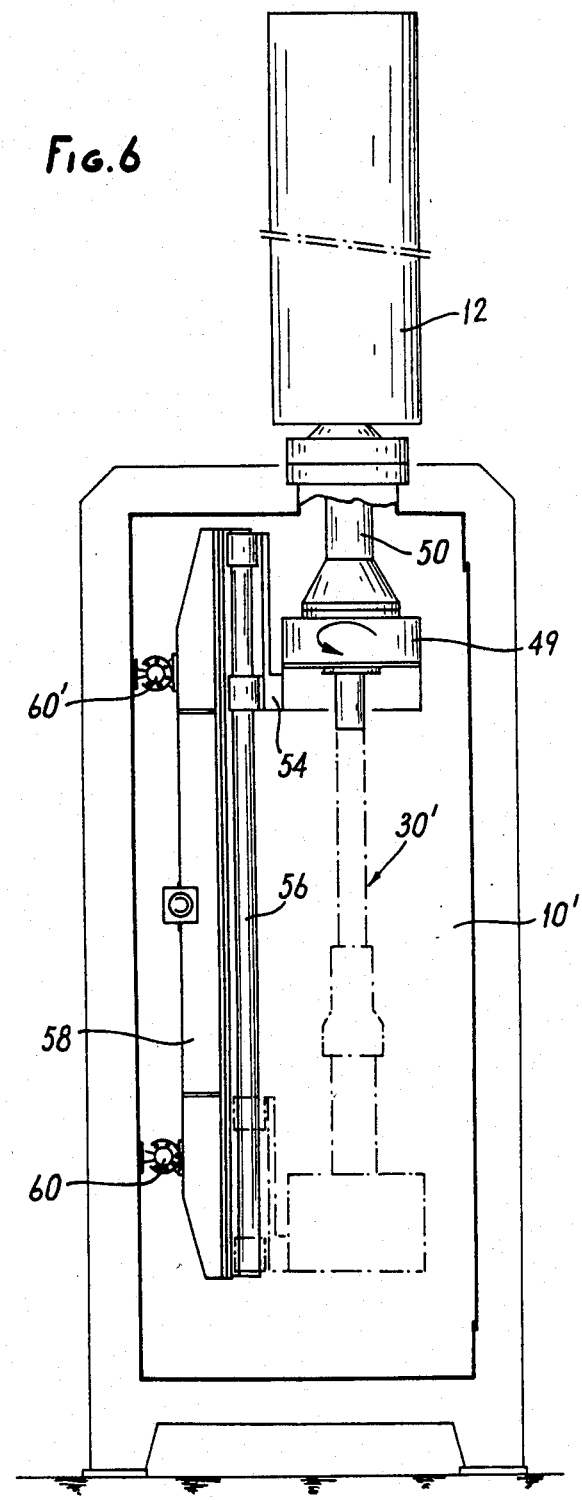

AUTOMATED FLEXIBLE INSTALLATION FOR A RAPID THERMOCHEMICAL TREATMENT

TECHNICAL FIELD

The present invention relates to a flexible installation for a rapid thermochemical treatment.

It is known that for increasing the hardness and fatigue strength of parts used in the mechanical industry, said parts are subjected to a thermochemical treatment consisting enriching the material of said parts with chosen chemical species, for example carbon or nitrogen, then cooling them down according to known cycles.

BACKGROUND OF PRIOR ART

The installations presently used which are carrying out this type of treatment are generally made as continuous lines or batch furnaces. In said installations, the heating and the thermochemical treatment are carried out in the same chamber, the quenching being effected by immersion in a vat connected to the furnace via a lock. The parts to be treated are placed on plates, in baskets or on belts which represent often 50% of the total charge of the furnace.

The known installations are notably suffering from the following requirements and disadvantages:

1. a dispersion of the quality of the treated parts, due to the difficulty of obtaining homogeneity of the temperature and distribution of the active gas in the charge;
2. the length of the cycles, for the enrichments of reduced thickness, being tied to the use of conventional heating means, by convection-radiation, and to the research of a minimum of homogenity;
3. when operation incidents occur, a risk of having the entire charge or the contents of the furnace rejected, as the case may be;
4. high explosion hazards, tied to the size of the furnaces, to the atmospheres used and to the quenching vats;
5. the production costs are on the one hand increased due to the overconsumption necessitated by the joint heating of the baskets, plates or belts and the mass of the furnaces refractories, and on the other hand to the cyclical renewal of said conditioning materials made of noble alloys;
6. a lack of flexibility of the installations, the furnaces being oversized for the heaviest and bulkiest charges and having therefore a surplus capacity and being ill adapted to charges which are different from the thermal and aerodynamic points of view;
7. a difficulty of reducing, where continuous lines are involved, the quality dispersion and the length of the cycles, the parts which are preheated and those which are at the stage of diffusion being in the same enclosure.

These requirements and disadvantages, and the fact that such installations should be conducted by a specialized personnel, are such that it cannot be easily envisaged to integrate them in machining lines for the manufacture of large series of mechanical parts.

OBJECTS AND SUMMARY OF THE INVENTION

Therefore, the installation relates to an installation designed in such manner as not to exhibit the disadvantages of the hereabove specified known installations.

An installation according to this invention is substantially characterized in that it comprises a transfer lock for the parts under a controlled atmosphere; a plurality of part treatment modules such as notably preheating modules, thermochemical treatment modules, quenching modules, all said modules being connected to said transfer lock; a loading lock; an unloading lock and a handling means of the parts disposed in said transfer lock in order to provide for the successive transfers of the parts to be treated to the various modules.

It will be appreciated that according to the invention, each of the steps of a thermochemical treatment cycle of the parts is carried out in one of said treatment modules, the characteristics of which can be optimized as a function of its specific role in the cycle, for example:

a thermal transfer with adaptation to the transfer modes;

a mass transfer or a quenching.

The complete cycle includes steps of various durations, due to the kinetics involved (diffusion speeds of the chemical species different to the diffusion speeds of the heat through the surface), the shortest step of the programme (basic step) defining the capacity of a module. According to the invention, for each successive treatment step, the number of modules is, in whole numbers, proportional to the relation between the duration of the step in consideration and the duration of the basic step.

According to a feature of this invention, the parts arriving continuously from the manufacturing line are stacked in columns, in which they can be separated by spacers, and they are delivered, by using a robot, to the corresponding station of the unloading lock, where a dome comes atop the column in order to enclose it tightly, the column of parts being then transferred to the first treatment module, for example the preheating module, via the transfer lock and the handling means of the parts.

According to the invention, the transfer lock can be a chamber of circular section, on the periphery of which are distributed the various modules, or a chamber of rectangular section along which are disposed the modules, the disposition being a function of the lay-out and of the work to be carried out.

BRIEF DESCRIPTION OF DRAWINGS

Various other features and advantages of this invention will become more apparent from the hereafter description of two embodiments thereof having no limiting character, with reference to the accompanying drawings wherein:

FIG. 5 is a side elevation view, partially broken away, of a second embodiment of the installation according to the installation, comprising a transfer lock of rectangular section, and FIG. 6 is a sectional view of FIG. 5, in a transverse vertical plane.

DETAILED DESCRIPTION OF THE EMBODIMENTS

Figure 1:
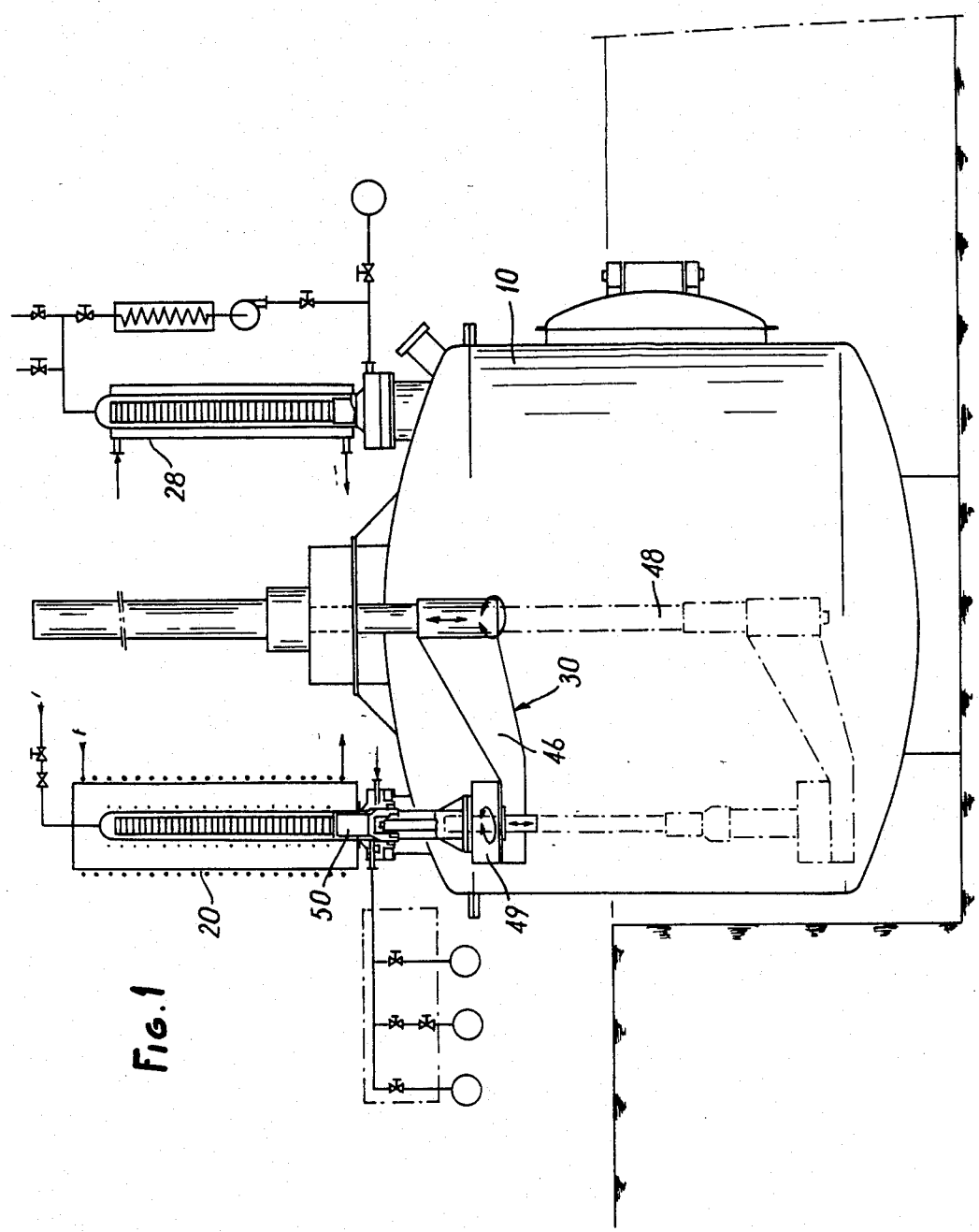
FIG. 1 is an elevation and vertical sectional view of a first embodiment of an installation according to this invention, including a transfer lock of circular section.
Figure 2:
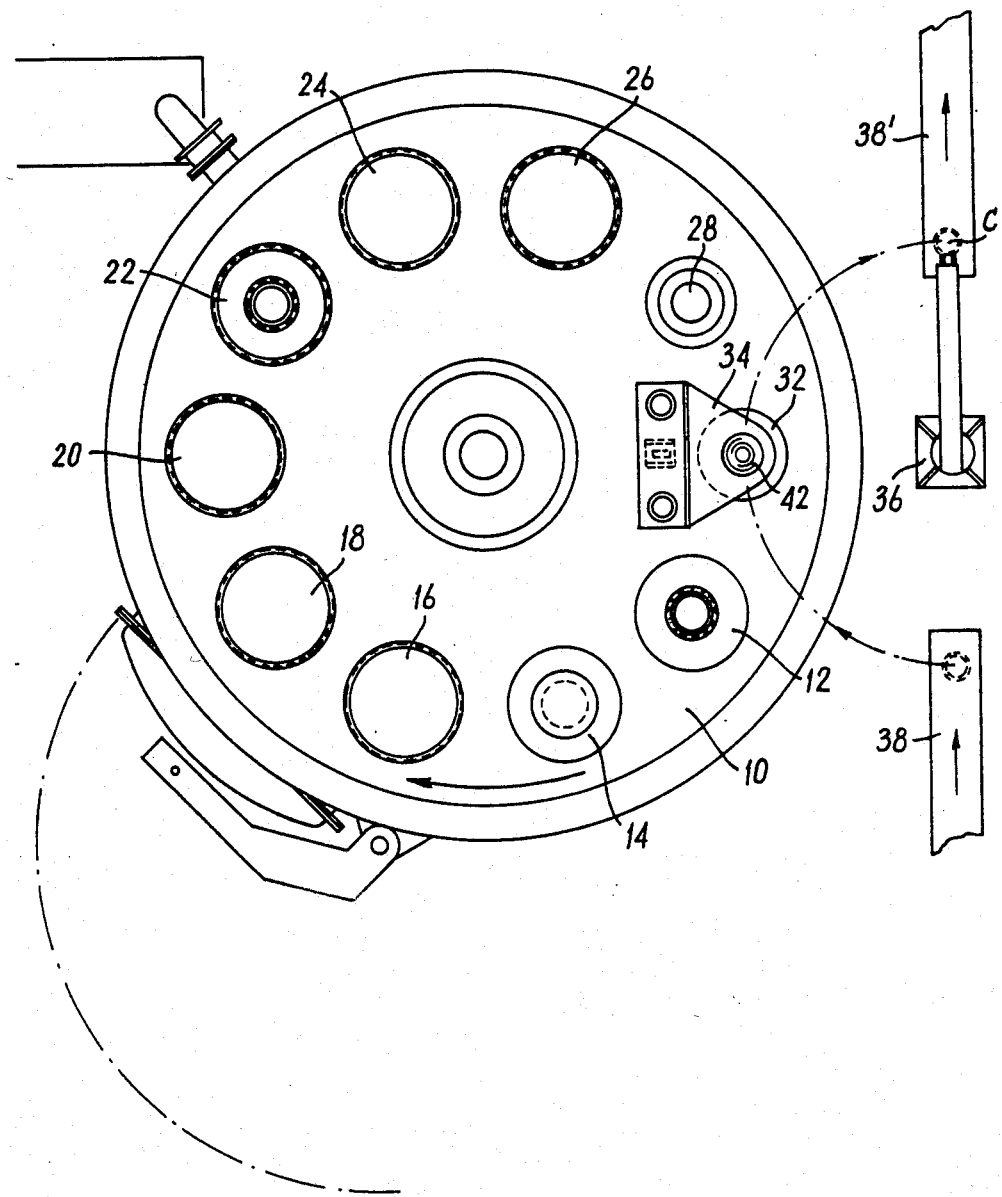
FIG. 2 is a plan view of FIG. 1.

With reference to FIGS. 1 and 2, one sees that the installation according to the invention includes substantially the following elements:

a transfer lock 10 which, in this embodiment, is in the shape of an enclosure of circular section;

a plurality of treatment modules for the parts, including for example preheating modules 12, 14, cementing-/diffusion modules 16 to 26, and a quenching module under a controlled atmosphere 28, all said modules being mounted on the upper wall of the transfer lock and being connected to said lock;

a handling means 30, placed in the transfer lock 10 and designed in such manner as to provide for the transfer of the parts to be treated between the various modules;

a loading/unloading station 34 of the parts, with its lock 32 and its mobile dome 42; and a feeding robot 36 for feeding parts to the installation.

Figure 3:
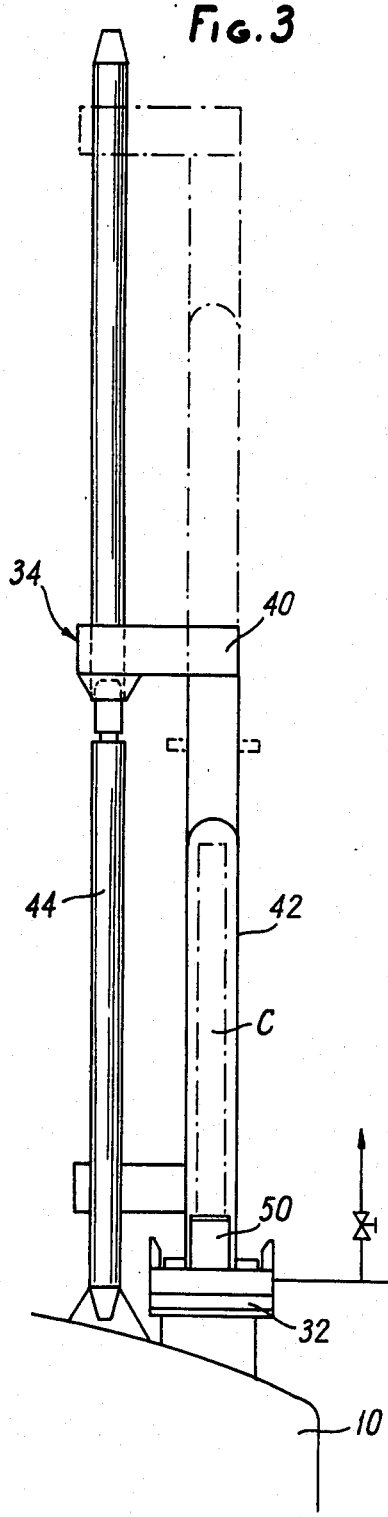
FIG. 3 is a partial view showing the loading/unloading station of the installation of FIGS. 1 and 2.
Figure 4:
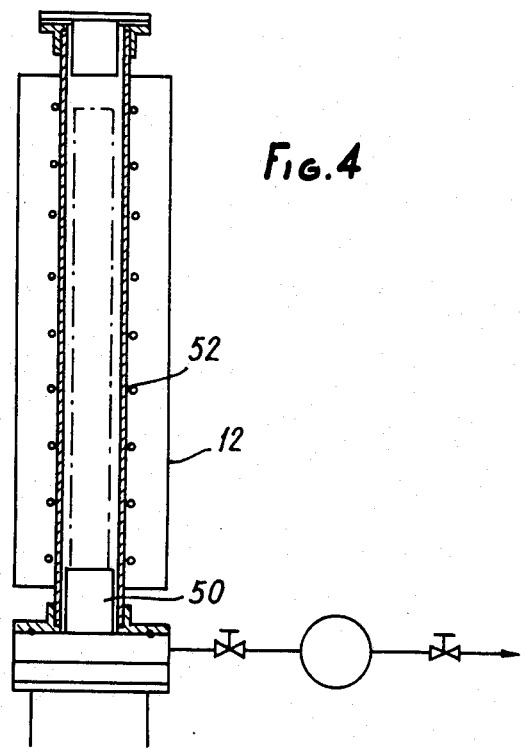
FIG. 4 is a detailed view showing, in a vertical cross-section, the preheating module of the installation.

The parts, arriving continuously from a manufacturing line, are stacked in a column C, in which they can be separated by spacers. The columns of parts C can be fed to the installation by means of a conveyor 38, from which they are taken by the feeding robot 36 which delivers successively each column C to loading station 34. This loading station 34 is made substantially of a bracket 40 FIG. 3 which can move vertically along a rod 44, and which carries the mobile dome 42. Said dome 42 comes atop the column of parts C, in order to enclose it tightly. The enclosure defined by the dome is then set under an atmosphere and a pressure identical to those prevailing in transfer lock 10, the reduced volume of said enclosure allowing a rapid purging.

The handling means or handling robot 30 provides then for the transfer of column C successively to the different treatment modules, via transfer lock 10.

Said transfer lock is made of an enclosure the inside wall of which exhibits a low emissivity in order to reduce to the minimum the exhanges due to thermal radiations, during the transfers of the columns of parts. It is placed in a neutral atmosphere in order to reduce to the minimum the risks of oxidation, explosion and/or under a low pressure for reducing the exchanges by convection.

The handling robot 30, placed in the transfer lock 10, is in the shape of an arm 46 which can move about a central column 48 along which it can also slide. Said arm 46 carries at its end a plate 49 on which is placed the support 50 of the column of parts C, said support being designed in such manner as to provide the tightness of each treatment module with respect to transfer lock 10.

The column of parts C having been fed to the preheating module 12, the latter, tightly closed, is then filled with a gas at the desired pressure. In this embodiment, one uses a heating provided by inductors 52, the advantage of which is rapidity. However, one can use any other preheating or treatment means. As soon as the treatment temperature has been reached, module 12 is purged at the pressure and at the atmosphere identical to those of transfer lock 10, and column C is transferred to the next module.

In this non limiting embodiment, two preheating modules 12, 14 are being provided in order to reach a better homogeneity: in the first module 12 is carried out a preheating underneath the Curie point and in the second module 14 is carried out a preheating at a temperature higher than the Curie point. The feeding frequencies of inductors 52 are chosen so as to obtain the required heating mode: either a heating localized to the surfaces to be enriched, or a heating to the core. The feeding frequencies, and the necessity to divide the heating into two stages (and therefore to provide two modules), are determined by preliminary tests. Each preheating module can be equipped with a gas distribution system in order to carry out a reduction of the superficial oxides and/or a degreasing of the parts during the preheating cycle.

The preheating in one or two stages being completed, the handling robot 30 transfers then column C to the stand-by thermochemical treatment module 16 to 26. Said module is tight and set under a pressure appropriate to the gas chosen.

In each of the thermochemical treatment modules 16–26, the enrichment of the parts is obtained by a circulation of the gas, the parts being maintained at the desired temperature. At the end of the enrichment phase, the atmosphere of the module is purged and replaced by that necessary to the diffusion. At the end of the diffusion, the module atmosphere is purged and replaced by an atmosphere identical in pressure and composition to that of transfer lock 10, so that handling robot 30 can transport the column of parts to the next module.

The thermochemical treatment can be carried out at will under pressures of reduced values, that is a few absolute millibars, or at pressures higher than the atmospheric pressure, that is a few absolute bars for example.

In both cases, the gas distribution can be determined by test, as a function of the pressure, the type of parts to be treated and the height of the columns of parts.

The concentrations of added gas are fixed by tests correlated according to thermal and mass exchanges equations taking in account the aerodynamics of the chamber, the gas reaction kinetics and the balance thermodynamic parameters.

This enrichment of the parts can be carried out in a continuous manner, the proportion of added gas being a function of the duration determined as hereabove stated.

In order to improve the renewal of the reactive species, it is possible to work by feeding the module with gusts of added gas. The frequency of said gusts is determined by tests and correlated as a function of the various parameters: gas nature, concentration, volume, temperature, chamber size. It is possible to carry out an ionic treatment, the parts being then connected to the cathode and the enclosure to the anode.

The diffusion of the chemical species in the parts is carried out in the same module, preferably under vacuum or possibly under a neutral atmosphere or a regulated atmosphere of the added gas.

At the end of the thermochemical treatment, the handling robot 30 transports the column of parts to the quenching module 28. The quenching of the parts can be performed by convection of cold gas, a mist, or the impact of a liquid jet, or a hybrid solution of said three means, the quenching fluid circulating in the module. The parameters regulating the exchange, viz.:

the gas nature, its temperature, its speed in the module and its distribution;

the nature of the mist, its passage speed, the size and proportions of the droplets, the size of the drops, the distance between the ejection nozzles and the parts, are determined experimentally.

In the case of an exchange where a liquid is more or less dispersed during the first part of the cooling operation, the module and its peripheral equipments are dried by using the calories discharged by the parts to be cooled.

The module can be provided with a double wall enclosure; said enclosure is traversed by the refrigerating liquid which allows cooling down said parts by radiation, this being made possible due to the fact that the parts are arranged in columns.

At the end of the quenching, module 28 is purged, set under an atmosphere identical to that of lock 10, and the column is taken by the handling robot 30 in order to be transferred to the loading/unloading module 32, from where it is carried away by the unloading robot 36 and the evacuation conveyor 38'.

In the variant shown in FIGS. 5 and 6 are present the same constituent elements as those of the hereabove described installation, the essential difference being that transfer lock 10' is made of an enclosure of rectangular section, on the top of which are aligned the various modules.

In this alternative embodiment, handling robot 30', which transfers the columns of parts between the various modules 12-28, from the loading module to the unloading module 32', is in the form of an arm 54, sliding along vertical columns 56, carried by a vertical carrier 58 moving transversely along lock 10' on rolling tracks 60, 60', the other elements of said robot being identical to those of the handling robot 30 hereabove described.

It will be appreciated that the in an installation according to this invention, each module or series of modules is adapted, in size and geometry, to the type of parts to be treated, a change of the type of the parts, outside certain tolerances, necessitating only a simple change of modules. This brings about in particular the following advantages:

a flexibility as regards production;

the adaptation of the modules to the parts produces an improvement of quality, due to a better temperature homogeneity;

a better distribution of the gases;

the treatment of column batches allowing using induction as a heating means, which is not possible in standard furnaces;

when there is an incident, only a fraction of the production is disturbed, and not the entire charge of the installation;

the explosion hazards are suppressed as compared to standard installations since:
the improvement of the aerodynamics of the charge-module assembly allows an efficient usage of gas and/or mist quenchings, and therefore a quenching in oil less necessary;
on the other hand, the fractionation of the charges reduces the volumes of explosive gas; said volumes are limited in fact to the spaces remaining free in the thermochemical treatment modules, that is the volume between the parts and the walls;
the fractionation in batches allows using so-called low pressure techniques, reducing still more the explosion hazards;

the improvement of the cooling speeds by using He or $H_2$, which is made possible by the reduced sizes of the chamber;

the production costs are reduced as compared to standard installations, since the supports of the columns have a weight which is relatively very inferior to that of the plates or baskets of standard installations;

said costs are reduced since it is no more necessary to heat a chamber of large size with its refractories;

said costs are reduced since the geometry of the installation is adapted as much as possible to the geometry of the parts and avoids the overcapacity of said installation;

all the parts treated in the same enclosure are subjected to the same practical treatment, thereby avoiding the problems of atmosphere control.

Of course, this invention is not limited to the embodiments described and/or shown and it encompasses all the variants thereof. Particularly, one can envisage other geometries and dispositions as regards the automated installation which is the object of this invention, notably the treatment modules of the parts can be mobile on a carrousel, the feeding being stationary.

What we claim is:

1. An automated installation for the thermochemical treatment of parts comprising:
    (a) a transfer lock for exposing said parts to a controlled atmosphere;
    (b) a plurality of treatment modules associated with the transfer lock, said plurality of treatment modules comprising means for thermochemically treating said parts, each of said treatment modules being mounted stationary on the outside of said transfer lock for direct transfer of said parts between each of said modules through said transfer lock;
    (c) a loading lock for loading said parts into said transfer lock;
    (d) an unloading lock for unloading said parts from said transfer lock; and
    (e) a handling robot positioned within said transfer lock for successively transferring said parts from one of said modules to another of said modules through said transfer lock.

2. The installation as defined by claim 1 wherein said plurality of treatment modules include two preheating modules comprising means for preheating said parts.

3. The installation as defined by claim 1 wherein said plurality of treatment modules comprises means for quenching the parts.

4. The installation as defined by claim 1 wherein said transfer lock comprises a cylindrical enclosure having said modules mounted around the top periphery of said enclosure, each of said modules being in communication with said transfer lock.

5. The installation as defined by claim 4 further comprising means for stacking said parts into columns.

6. The installation as defined by claim 5 further comprising means for positioning a dome over said column of parts at said loading lock so as to sealingly enclose said parts, and wherein said handling robot transfers said column of parts within said dome from said loading lock to a first module through said transfer lock.

7. The installation as defined by claim 6 wherein said handling robot comprises an arm adapted to rotate around a central column and to slide vertically along said column, said arm carrying a plate for supporting said column and sealing each module relative to said transfer lock when said column is fully inserted therein.

8. The installation as defined by claim 1 wherein said transfer lock is a rectangular enclosure with each of said modules being mounted longitudinally along the top of said enclosure, each of said modules being in communication with said transfer lock.

9. The installation as defined by claim 8 further comprising means for stacking said parts into columns.

10. The installation as defined by claim 9 further comprising means for positioning a dome over said column of parts at said loading locks so as to sealingly enclose said parts, and wherein said handling robot transfers said column of parts within said dome from said loading lock to a first module through said transfer lock.

11. The installation as defined by claim 10 wherein said handling robot comprises an arm adapted to slide along vertical columns carried by a vertical carrier adapted to move transversely along said transfer lock along rolling tracks within said transfer lock, said arm carrying a plate for supporting said column and sealing each module relative to said transfer lock when said column is fully inserted therein.

12. The installation as defined by claim 2 wherein one of said preheater modules is adapted to heat said parts to below the curie point of the parts, and wherein the second of said preheaters is adapted to heat said parts above the curie point of said parts.

* * * * *